United States Patent [19]
Kobayashi et al.

[11] Patent Number: 4,691,983
[45] Date of Patent: Sep. 8, 1987

[54] OPTICAL WAVEGUIDE AND METHOD FOR MAKING THE SAME

[75] Inventors: Toshio Kobayashi; Kazumasa Takagi, both of Tokyo; Tokuumi Fukazawa, Tachikawa, all of Japan

[73] Assignee: Hitachi, Ltd., Tokyo, Japan

[21] Appl. No.: 660,144

[22] Filed: Oct. 12, 1984

[30] Foreign Application Priority Data

Oct. 14, 1983 [JP] Japan ................. 58-190739
Oct. 14, 1983 [JP] Japan ................. 58-190740

[51] Int. Cl.⁴ ................................................ G02B 6/10
[52] U.S. Cl. .............................. 350/96.12; 350/96.13; 350/96.30
[58] Field of Search ............. 350/96.29, 96.30, 96.34, 350/96.12, 96.13

[56] References Cited

U.S. PATENT DOCUMENTS

3,810,688  5/1974  Ballman et al. ............ 350/96.34 X

FOREIGN PATENT DOCUMENTS

0058106  4/1982  Japan ............................ 350/96.34

OTHER PUBLICATIONS

"Integrated Optics: A Report on the 2nd OSA Topical Meeting", by Pole et al, Applied Optics, Mar. 1975/vol. 14, No. 3.

Primary Examiner—William L. Sikes
Assistant Examiner—Akm E. Ullah
Attorney, Agent, or Firm—Antonelli, Terry & Wands

[57] ABSTRACT

Optical waveguide and the method for making the same, in which a semiconductor laser diode and an optical isolator are formed on one substrate in a monolithic manner. At the moment, a semiconductor laser diode is made by a III–V compound semiconductor crystal, such as GaAs, InP, etc., and an optical isolator is made of iron garnet to fabricate these in monolithic, and this invention was established by developing the technology to monocrystallize at least a small part of the garnet film containing no iron which is deposited on the semiconductor substrate and to use this as the seed crystal for the said phase epitaxial growth of the iron garnet film which forms the iron garnet optical waveguide.

12 Claims, 11 Drawing Figures

OPTICAL WAVEGUIDE AND METHOD FOR MAKING THE SAME

BACKGROUND OF THE INVENTION

1. Field of the Invention

This invention relates to an optical eaveguide used for optical communication and to a method for making the same.

2. Description of the Prior Art

Recently practical application of optical waveguides has been developed rapidly, and research and development for miniaturization and obtaining high reliability of optical parts have been pushed actively. For stabilizing a laser light source, an optical isolator made of magneto-optical material is used in a component of an optical communication system.

Prior art optical isolators are known having a fundamental construction such as that shown in FIG. 1 [e.g. Taki, Miyazaki, Akao, Denki Tsushin Gakkai Gijyutsu Hōkoku (Technical Reports of the Japanese Electrical Communication Society) MW 80-95 (1981)]. That is, it is so constructed that a Bi:YIG film 2 and an upper layer made of ZnO 3 are formed by RF sputtering method on a GGG monocryptal substrate 1 and that further a mode selection circuit 4 consisting of an Al clad layer, a non-reciprocal circuit 5 and a reciprocal circuit 6 made of magnetized layers, and rutile prisms 7, 8 are added to the substrate. In this optical isolator, an incident laser beam coming through the rutile prism 7 is so influenced by Faraday effect and by Cotto-mouton effect that its polarization plane rotates and emerges from the rutile prism 8. On the other hand, since an incident laser beam coming through the rutile prism 8 is so influenced by Faraday effect and by Cotton-Mounton effect that its polarization plane further rotates, it cannot pass through the rutile prism 7.

The isolator described above is a representative example of optical isolators. However, since an optical isolator having such a construction consists of parts usually made of oxides, when it was apppplied to optical intergrated circuits or integrated optics, it was not possible to combine it with a III-V compound semiconductor laser diode generally used as a light source on a III-V compound semiconductor optical waveguide in a monolithic form. this is due to the fact that the techniques for forming a monocrystal layer on an amorphous substrate on a monocrystal substrate made of a substance which is different from that of the monocrystal layer have not yet sufficiently been developed. In this respect, in order to give some examples of the prior arts methods for forming a monocrystal layer on an amorphous substrate, e.g. a method for monocrystallizing polycrystalline Si deposited in the form of an island on amorphous $Si_3N_4$ by laser annealing method, published by J. F. Gibbons et al. [J. F. Gibbons et al., Appl. Phys. Lett., 34, 12, 831 (1979) ], and an SOI forming method by means of a splitted beam, published by Aizaki [Preliminary announcement for the 30th United Conference of Societies Related to Applied Physics in Japan, spring 1983, 6a-T-10, p. 660] can be cited.

SUMMARY OF THE INVENTION

This invention has been made in order to remove the drawbacks described above and the first object of this invention is to provide a multifunctional optical waveguide having such a construction that it is combined with a III-V compound semiconductor laser diode or a III-V compound semiconductor optical waveguide in a monolithic form. The second object of this invention is to provide a small planar type optical waveguide; the third object of this invention is to provide a buried type optical waveguide; the fourth object of this invention is to provide an optical waveguide made of iron garnet; the fifth object of this invention is to provide an optical isolator comprising an optical waveguide according to this invention; the sixth object of this invention is to provide an optical integrated circuit using an optical waveguide according to this invention; and the seventh object of this invention is to provide a method for making an optical waveguide according to this invention.

In order to achieve these objects, this invention is characterized in that a garnet monocrystal domain containing no iron is located between a layer made of a substance having a thermal conductivity which is smaller than that of the garnet and an iron garnet monocrystal. It is also characterized in that an iron garnet optical waveguide is formed by monocrystallizing a garnet film containing no iron disposed in the form of an island on a substrate by zone melting method and by solid phase epitaxial growth of an iron garnet monocrystal film using the monocrystal thus obtained as a seed crystal. The basis of this invention is the fact that a technique for obtaining a determined monocrystal film has been established as a result of zone melting experiment by laser annealing of a garnet film containing no iron and also epitaxial growth experiment of an iron garnet monocrystal in a solid phase on a garnet monocrystal containing no iron. Further this invention has been made by finding that the island-shaped monocrystal film formed by the method described above can act as an optical waveguide, specifically as a buried type optical waveguide.

The reason why the iron garnet film is formed on the garnet film containing no iron, according to this invention is as follows. Growth in a liquid phase is more suitable than growth in a solid phase for forming a narrow and long monocrystal domain or region as an optical waveguide on a substrate made of a substance which is different from that of the region, and therefore zone melt is preferable. However, since iron garnet is an incongruent melting type compound, it cannot be melted. Consequently, it is necessary that after having once formed a garnet monocrystal film containing no iron, which can be melted, by zone melting method, an iron garnet film is grown in the solid phase thereon. Furthermore, it is possible to obtain more satisfactory optical waveguide characteristics by covering the optical waveguide made of iron garnet with the garnet containing no iron and having a refractive index which is slightly smaller than that of the iron garnet.

DESCRIPTION OF THE PREFERRED EMBODIMENTS

Hereinbelow this invention will be explained more in detail, referring to some examples.

EXAMPLE 1

Figure 1:
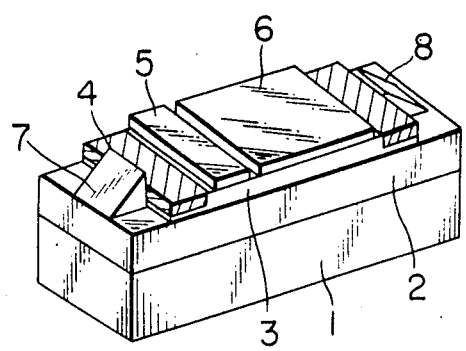
FIG. 1 is a perspective view showing the construction of a prior art optical isolator.
Figure 2:
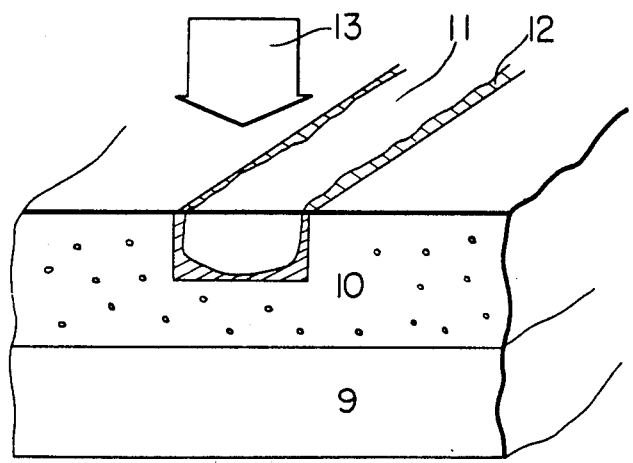
FIG. 2 is a scheme representing a process for monocrystallizing an island-shaped $Gd_3Ga_5O_{12}$ film by laser irradiation as an example of this invention.
Figure 3:
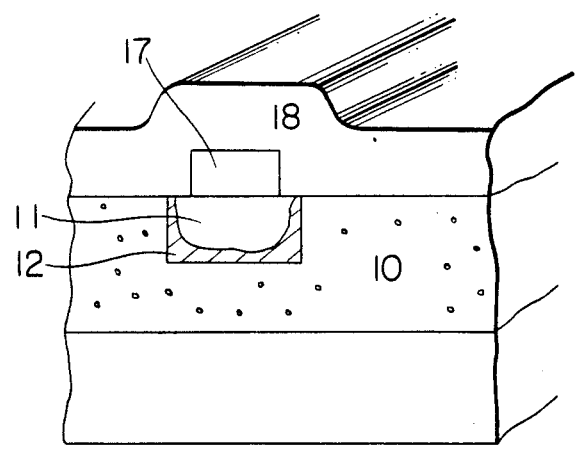
FIG. 3 is a scheme of an optical waveguide according to this invention.

FIG. 2 shows a process for fabricating an optical waveguide according to this invention. An amorphous film 10 such as $Sio_2$ or $Si_3N_4$ was formed on a GaAs substrate 9, in the surface portion of which a ditch was formed. This ditch was filled with $Gd_3Ga_5O_{12}$, which formed therefore an elonaged island. $Gd_3Ga_5O_{12}$ was deposited preferably by sputter evaporation method. Thereafter zone melt of $Gd_3Ga_5O_{12}$ was performed by sweeping a laser beam 13 along the island of $Gd_3Ga_5O_{12}$. In this moment, since molten $Gd_3Ga_5O_{12}$ was surrounded by amorphous material 10, such as $Sio_2$ or $Si_3N_4$, whose thermal conductivity is low, crystallization began at the surface portion, whose temperature was low. Consequently, an elongated monocrystal domain or region 11 was formed, as shown in FIG. 2. In this example, generation of polcrystals was observed at the portion 12 which was adjacent to the amorphous material 10.

On the island shaped monocrystal region 11 of $Gd_3Ga_5O_{12}$ thus formed a $Y_3Fe_5O_{12}$ film 17 was deposited also into the shape of an island along the monocrystal region 11 of $Gd_3Ga_5O_{12}$. Then, $Y_3Fe_5O_{12}$ was grown in a solid phase by heating it to 600°-800° C. As a result, an island-shaped monocrystal $Y_3Fe_5O_{12}$ 17 could be formed by using $Gd_3Ga_5O_{12}$ as a monocrystal substrate. Further a $Gd_3Ga_5O_{12}$ film was deposited thereon by evaporation method to constitute the upper portion 18 with a refractive index which was slightly smaller than that of $Y_3Fe_5O_{12}$. Thus a buried layer type optical waveguide according to this invention was fabricated.

EXAMPLE 2

Figure 4:
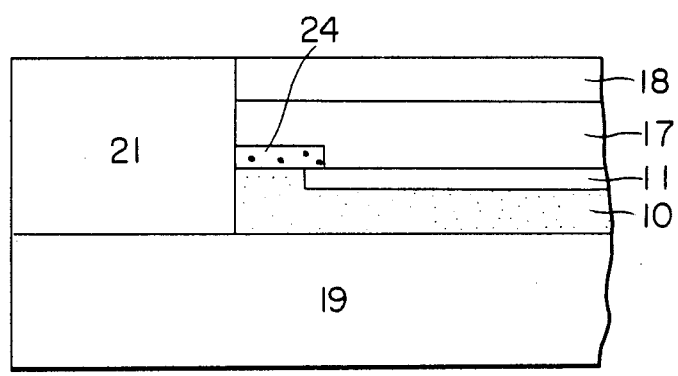
FIG. 4 is a cross-selectional view showing an optical waveguide combined in a monolithic manner with a laser light source as another example of this invention.

As indicated in FIG. 4, a $Gd_3Ga_5O_{12}$ monocrystal region 11 was formed by the method described in Example 1 on the extension of the optical axis of an InGaAsP semiconductor laser diode 21 formed on an InP monocrystal substrat 19. Further an $Si_3N_4$ film 24 was deposited by plasma CVD method as indicated in the figure. Then, after having deposited a $Y_3Fe_5O_{12}$ film 17 both on the $Gd_3Ga_5O_{12}$ monocrystal region 11 on the $Si_3N_4$ film 24, it was monocrystallized by solid phase epitaxial growth. As a result the $Y_3Fe_5O_{12}$ film 17 continued to grow also in the portion on the $Si_3N_4$ film and finally it could be monocrystallized as far as the boundary of the laser diode portion 21. Furthermore, it was coverd by a $Gd_3Ga_5O_{12}$ film 18. In this manner an optical wavefuide made of $Y_3Fe_3O_{12}$ could be formed on the extension of the optical axis of the laser portion.

EXAMPLE 3

Figure 5:
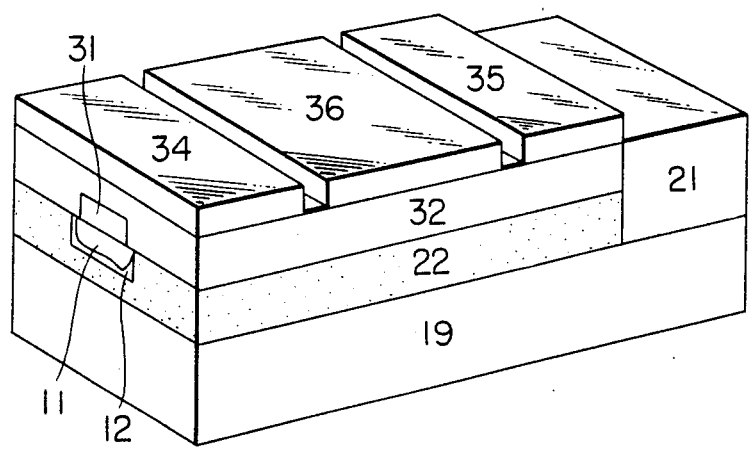
FIG. 5 is a perspective view showing an optical isolator combined in a monolithic manner with a laser light source as still another example of this invention.

An optical waveguide 31 consisting of a monocrystal film made of $(YBi)_3Fe_5O_{12}$ instead of $Y_3Fe_5O_{12}$ used in Example 2 was formed. As indicated in FIG. 5, mode selection circuits 34 and 35 made of Al films were disposed on the $Gd_3Ga_5O_{12}$ film 32 and further a reciprocal and non-reciprocal circuit 36 made of a magnetized film was formed. It became evident that the optical waveguide thus fabricated can act as an optical isolator since it lets the laser light coming from the semiconductor laser 21 emerge from another end without any attenuation, while light entering from this other end in the waveguide is attenuated before it reaches the laser portion 21. Furthermore the optical isolator according to this invention is characterized in that it is formed together with the laser light source on a common substrate into one body. Therefore miniaturization and high reliability of the whole device could be achieved.

EXAMPLE 4

Garnet films containing no iron idicated in Table 1 were formed instead of the $Gd_3Ga_5O_{12}$ film in Example 1 and they were monocrystallized by zone melting using laser irradiation. Thereafter, corresponding iron garnet films indicated in Table 1 were formed into island like shapes on these monocrystal domain thus obtained and iron garnet monocrystals were thus formed by solid phase epitaxial growth.

TABLE 1

| Example | Garnet containing no iron | Iron garnet |
|---|---|---|
| 1 | $(GdSm)_3Ga_5O_{12}$ | $(YBi)_3Fe_5O_{12}$ |
| 2 | $Sm_3Ga_5O_{12}$ | $(YBi)_3Fe_5O_{12}$ |
| 3 | $Sm_3Ga_5O_{12}$ | $(GdY)_3Fe_5O_{12}$ |
| 4 | $Nd_3Ga_5O_{12}$ | $(GdBi)_3Fe_5O_{12}$ |
| 5 | $Nd_3Ga_5O_{12}$ | $(GdEu)_3Fe_5O_{12}$ |
| 6 | $(SmNd)_3Ga_5O_{12}$ | $(YBi)_3Fe_5O_{12}$ |
| 7 | $(SmNd)_3Ga_5O_{12}$ | $Gd_3Fe_5O_{12}$ |
| 8 | $Dy_3Ga_5O_{12}$ | $(YbTm)_3Fe_5O_{12}$ |
| 9 | $Dy_3Ga_5O_{12}$ | $(TmBi)_3Fe_5O_{12}$ |
| 10 | $Y_3Ga_5O_{12}$ | $Lu_3Fe_5O_{12}$ |
| 11 | $Gd_3Ga_5O_{12}$ | $(YBi)_3Fe_5O_{12}$ |
| 12 | $Gd_3Ga_5O_{12}$ | $(TmBi)_3Fe_5O_{12}$ |

It was affirmed that the iron garnet monocrystals thus obtanined act as optical waveguides. Furthermore, an optical waveguide having a higher light confining efficiecny could be obtained by depositing another granet film containing no iron on each of these iron garnet monocrystals by deposition.

EXAMPLE 5

Figure 6:
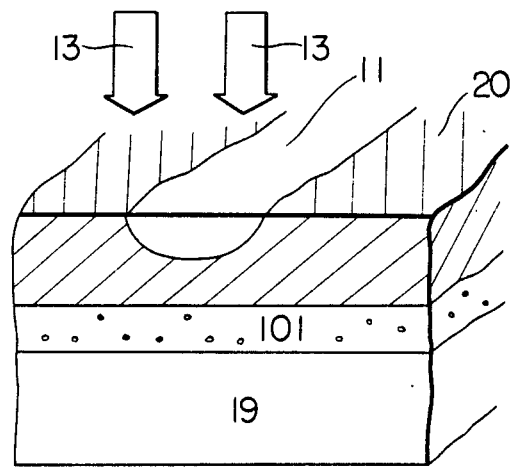
FIG. 6 is a scheme representing another process for monocrystallizing a $Gd_3Ga_5O_{12}$ film by laser irradiation.

FIG. 6 shows an example of the process for fabricating an optical waveguide according to this invention. An amorphours $Si_3N_4$ film 101 was formed on an InP monocrystal substrate 19 and furthermore a $Gd_3Ga_5O_{12}$ film was deposited thereon by sputter deposition method. Therefore the surface of the $Gd_3Ga_5O_{12}$ was irradiated by a laser beam 13 splitted into 2, while sweeping the laser beam along it. As a result, the surface of the $Gd_3Ga_5O_{12}$ was more and more melted and crystallized with continued irradiation by the laser beam 13 and a monocrystal region 11 could be fromed in the form of an island having a width which was nearly equal to the distance of the two splitted beams. In this case it was observed that the monocrystal region 11 was surrounded by a polycrystalline or amorphous domain 20. In this experiment it was often difficult to form an elongated monocrystal domain, when irradiate ion was made by a laser beam which was not splitted.

Figure 7:
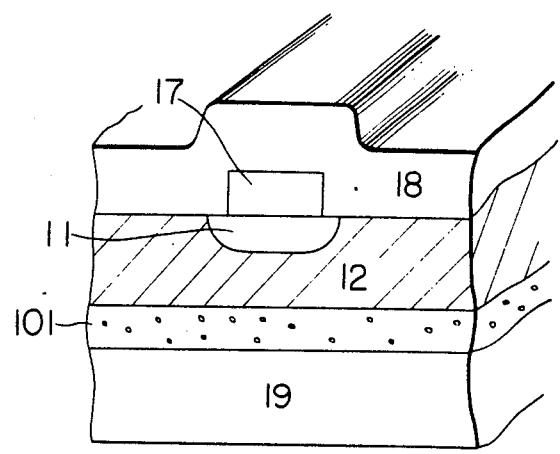
FIG. 7 is a scheme representing another example of the optical wavefuide according to this invention.

Then, an island-shaped $Y_3Fe_5O_{12}$ filnm 17 was formed on the island-shaped $Gd_3Ga_5O_{12}$ monocrystal region 11 as indicated in FIG. 7, and heated to 600°-800° C. for the solid phase growth of the $Y_3Fe_5O_{12}$ film in solid. In this manner an island-shaped $Y_3Fe_5O_{12}$ monocrystal could be grown. Moreover, a $Gd_3Ga_5O_{12}$ film 18 was deposited thereon by sputter evaporation to fabricate the buried type optical waveguide in this invention.

EXAMPLE 6

Figure 8:
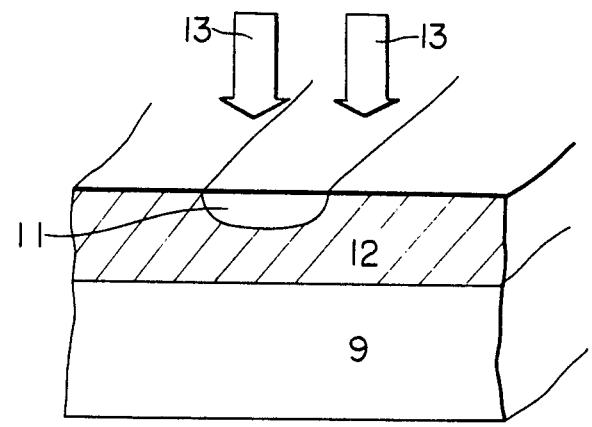
FIG. 8 is a scheme representing still another process for monocrystallizing a $gd_3Ga_5O_{12}$ film by laser irradiation.

FIG. 8 shows another example of the process for fabricating an optical waveguide according to this invention. A $Gd_3Ga_5O_{12}$ film was deposited on a GaAs substrate 9 by sputter evaporation and a $Gd_3Ga_5O_{12}$ monocrystal region 11 was formed by the same method as that described in Example 1. In the figure reference numeral 12 denotes an amorphous or polycrystalline region. Then a $Y_3Fe_5O_{12}$ film was formed on the $Gd_3Ga_5O_{12}$ monocrystal domain and grown in solid phase growth was conducted by the same method as that described in Example 5. In consequence, an island-shaped $Y_3Fe_5O_{12}$ was epitaxially grown to be a moncrystal on the $Gd_3Ga_5O_{12}$ moncrystal. Moreover a $Gd_3Ga_5O_{12}$ film was deposited thereon by sputter evaporation and a buried type optical waveguide could be formed by the same method as that used for FIG. 7.

EXAMPLE 7

Garnet films containing no iron indicated in Table 1 were formed instead of the $Gd_3Ga_5O_{12}$ film in Example 5 and they were zone melted by sweeping a laser beam splitted into 2 to form monocrystal domains. Further, corresponding iron garnet films indicated in Table 1 were formed in the form of an island on each of these monocrystal regions thus obtained and iron garnet monocrystals were formed by solid phase epitaxial growth.

It was affirmed that the iron garnet monocrystals thus obtanied act as optical waveguides. Futhermore, an optical waveguide having a higher light confining efficiency could be obtained by deposting another garnet film containing no iron on each of these iron garnet monocrystals by deposition.

EXAMPLE 8

Figure 9:
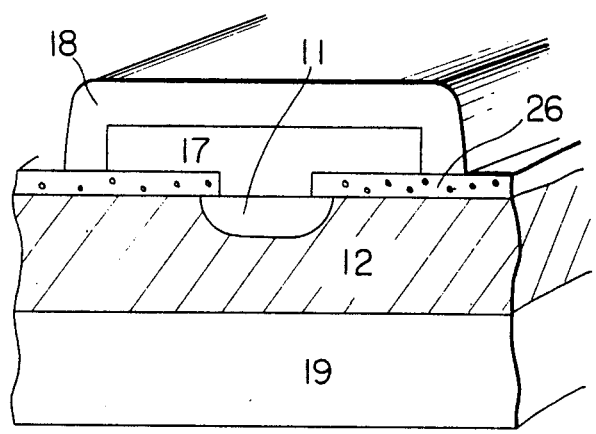
FIG. 9 is a scheme representing a transeversely wide optical waveguide.

After having formed a $Gd_3Ga_5O_{12}$ monocrystal region 11 in Example 6, and $SiO_2$ amorphous film 26 was deposited on the $Gd_3Ga_5O_{12}$ film 12 as indicated in FIG. 9. The $SiO_2$ amorphous film 26 had an opening right above the $Gd_3Ga_5O_{12}$ monocrystal region 11 as indicated in FIG. 9. Futher, a $Y_3Fe_5O_{12}$ film was deposited in an area which was larger than the opening by sputter deposition and a $Y_3Fe_5O_{12}$ monocrystal film 17 was formed by solid phase epitaxial growth. In this case, the solid phase epitaxial growth of the $Y_3Fe_5O_{12}$ film began at the opening of the amorphous film 26 and also continued thereon. It was proved that in this manner the $Y_3Fe_5O_{12}$ film was finally wholly monocrystallized. Further a $Gd_3Ga_5O_{12}$ film 18 was deposited thereon by sputter deposition and a buried type large area optical waveguide could be formed.

EXAMPLE 9

Figure 10:
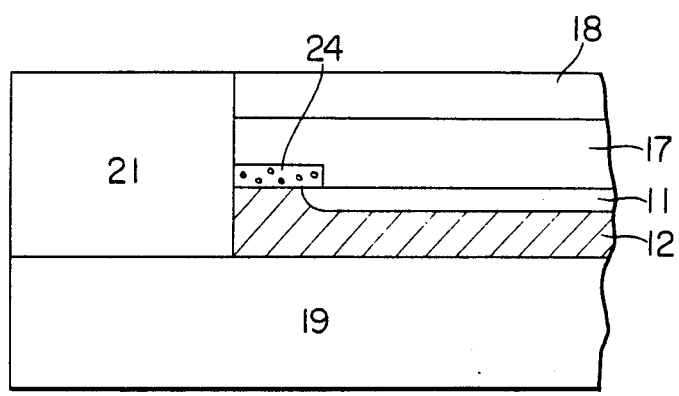
FIG. 10 is a cross-sectional view showing another optical waveguide combined in a monolithic manner with a laser light source.

As indicated in FIG. 10, a $Gd_3Ga_5O_{12}$ monocrystal region 11 was formed on the extension of the optical axis of the InGaAsP semiconductor laser diode 21 disposed on the InP monocrystal substrate 19 by the method described in Example 5. Thereafter an $Si_3N_4$ film 24 was deposited as indicated in the figure by plasma CVD method. After having deposited a $Y_3Fe_5O_{12}$ film both on the monocrystal domain 11 and on the $Si_3N_4$ film 24, it was monocrystallized by solid phase epitaxial growth. As a result, crystallization of the $Y_3Fe_5O_{12}$ film 17 also continued on the $Si_3N_4$ film and the $Y_3Fe_5O_{12}$ film could be monocrystallized as far as the boundary of the laser diode portion 21. Futher, by covering the device with a $Gd_3Ga_5O_{12}$ film 18, an optical guide consisting of $Y_3Fe_5O_{12}$ could be formed on the extension of the optical axis of the laser diode portion.

EXAMPLE 10

Figure 11:
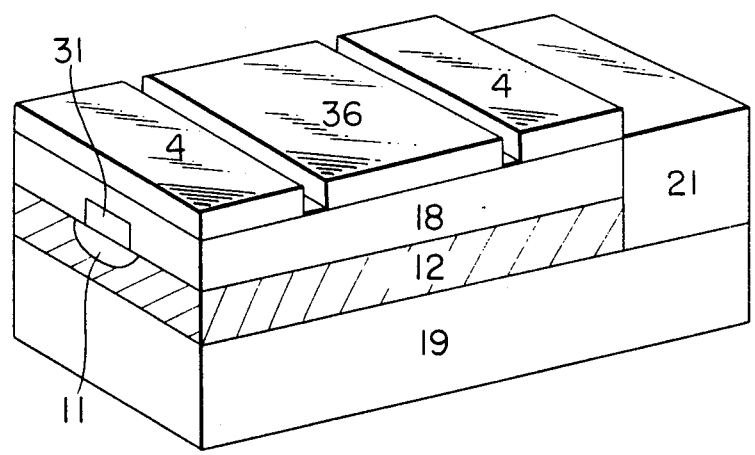
FIG. 11 is a perspective view showing another optical isolator combined in a monolithic manner with a laser light source.

An optical waveguide 31 consisting of a monocrystal film made of $(YBi)_3Fe_5O_{12}$ instead of $Y_3Fe_5O_{12}$ used in Example 9 was formed. As indicated in FIG. 11, mode selection circuit 4 made of Al films were disposed on the $Gd_3Ga_5O_{12}$ film 18 and further a reciprocal and non-reciprocal circuit 36 made of a magnetized film was formed. It became evident that the optical waveguide thus fabricated can act as an optical isolation since it lets the laser light coming from the semiconductor laser diode 21 emerge from another end without any attenuation, while light entering from this other end in the waveguide is attenuated before it reaches the laser diode portion 21. Furthermore, the optical isolator according to this invention is characterized in that it is formed together with laser light source on a common substrate into one body. Therefore, miniaturization and high reliability of the whole device could be achieved.

For those matters which have not been described, in this specification, on the optical waveguide and the method for fabricating it, use may be made of the well-known technique and knowledge in the field of this invention to use this invention.

As explained in the above examples, since the optical waveguide according to this invention has such a construction that it can be combined in a monolithic manner with a III-V compound semiconductior laser diode or a III-V compound semiconductor optical waveguide, the invenion permits to fabricate small and highly reliable optical isolators or optical integrated circuits. According to the method of this invention it is also possible to form planar type optical waveguides and buried type optical waveguides easily. Furthermore zone melting used in the process according to this invention can be carried out by using a doughnut-shaped laser beam, an electron beam, etc. besides the splitted laser beam used in the above described examples.

We claim:

1. An optical waveguide comprising:
   a substrate;
   a garnet layer formed over said substrate, said garnet layer containing no iron and having a monocrystal region formed in a part thereof; and
   an iron garnet monocrystal layer provided on said monocrystal region.

2. An optical waveguide according to claim 1, wherein another layer is disposed between said ganet layer and said substrate, said another layer comprising a material having a thermal conductivity lower than that of said garnet layer.

3. An optical waveguide according to claim 1, wherein said substrate is made of a III-V compound.

4. An optical waveguide according to claim 3, wherein a III-V compound semiconductor laser is formed on said substrate and is arranged to be adjacent to said iron garnet monocrystal layer.

5. An optical waveguide according to claim 1, wherein said iron garnet monocrystal layer is covered with a garnet thin film containing no iron.

6. An optical waveguide according to claim 1, wherein a portion of said garnet layer other than said monocrystal region is amorphous or polycrystal.

7. An optical waveguide according to claim 2, wherein said monocrystal region is shaped as an elongated island extending within the garnet layer containing no iron, which is in the form of an elongated island extending within said another layer.

8. An optical waveguide according to claim 1, wherein said garnet layer containing no iron is formed on said substrate.

9. A method for manufacturing an optical waveguide comprising steps of:

forming, over a substrate, a garnet layer containing no iron;

monocrystallizing said garnet layer through zone melting to form a monocrystal region in a part thereof;

forming an iron garnet thin film on said monocrystal region of said garnet layer; and monocrystallizing said iron garnet thin film, through solid phase epitaxy, with said monocrystal garnet region being used as seed crystal.

10. A method for manufacturing an optical waveguide according to claim 9, further comprising prior to the step of forming a garnet layer containing no iron on said substrate, forming, on said substrate, layer of material having a thermal conductivity lower than that of said garnet layer containing no iron, said garnet layer containing no iron being formed on said layer of material.

11. A method for manufacturing an optical waveguide according to claim 9, further comprising the step of forming another garnet thin film containing no iron on said iron garnet monocrystallized thin film to cover the monocrystallized thin film with the another garnet thin film.

12. A method for manufacturing an optical waveguide according to claim 9, wherein the garnet layer containing no iron if formed on said substrate.

* * * * *